United States Patent [19]

Georges et al.

[11] 4,427,891

[45] Jan. 24, 1984

[54] VARIABLE TEMPERATURE STAGE DEVICE FOR ELECTRON MICROSCOPE

[76] Inventors: Adrien J. P. Georges, 41, av. Plaine Fleurie; Jean-Pierre Gonchond, 59 A, rue des Ayguinards, both of Meylan, France, 38240

[21] Appl. No.: 185,950

[22] Filed: Sep. 10, 1980

[30] Foreign Application Priority Data

Sep. 20, 1979 [FR] France ................. 79 23437

[51] Int. Cl.³ ........................... H01J 37/20
[52] U.S. Cl. ................ 250/443.1; 250/442.1; 250/311
[58] Field of Search ........... 250/443, 440, 311, 442, 250/277 CH; 378/80, 81

[56] References Cited

U.S. PATENT DOCUMENTS

| | | | |
|---|---|---|---|
| 2,417,213 | 3/1947 | Picard | 250/443 |
| 2,858,444 | 10/1958 | Leisegang | 250/443.1 |
| 3,244,877 | 4/1966 | Herrmann et al. | 250/443 |
| 3,373,277 | 3/1968 | Heide | 250/443 |
| 3,388,251 | 6/1968 | Grasenick et al. | 250/442 |
| 3,444,365 | 5/1969 | Loebe | 250/443 |
| 3,600,576 | 8/1971 | Carter et al. | 378/80 |
| 3,723,006 | 3/1973 | Thomas, Jr. | 378/81 |
| 3,969,623 | 7/1976 | Klingen et al. | 378/80 |
| 4,220,415 | 9/1980 | Staab et al. | 250/343 |
| 4,262,194 | 4/1981 | Hayward | 250/443 |

FOREIGN PATENT DOCUMENTS 1910771 3/1969 Fed. Rep. of Germany .
2138567 8/1971 Fed. Rep. of Germany .

OTHER PUBLICATIONS

Kirov et al., "A High-Temperature Attachment for the HZG-1 and HZG-3 X-Ray Goniometers", Kristall und Technik, 10-7-75, pp. 69-70.
Schoen, "Sapphire Window Mountings for Low Temperature Spectroscopy", Rev. Sci. Instr. 38 (10), 1531-1532, Oct. 1967.

Primary Examiner—Alfred E. Smith
Assistant Examiner—Carolyn E. Fields
Attorney, Agent, or Firm—Lowe, King, Price & Becker

[57] ABSTRACT

A variable temperature stage device comprises a support detachable from a goniometer of a microscope, a specimen holder, a cooling head and holder heating elements. The thermal capacity is restricted by bracing the specimen holder on discontinuous insulating rests of an insulating element and a flexible metal joint pressed against the cooling head. The insulating element bears against the specimen holder and is supported by the detachable support. The bracing is carried out when the support is mounted on the goniometer by means of a rod which is controlled from outside of an entry port of the microscope, and a connecting cylinder screwed in the goniometer. The heating elements are optical radiation elements such as incandescent lamps inserted in the insulating element facing the specimen holder.

18 Claims, 12 Drawing Figures

VARIABLE TEMPERATURE STAGE DEVICE FOR ELECTRON MICROSCOPE

CROSS REFERENCES TO RELATED APPLICATIONS

Applicants hereby make cross references to their French Patent Application No. PV 79-23439, filed Sept. 19, 1979 and claim priority thereunder following the provisions of 35 U.S.C. 119.

BACKGROUND OF THE INVENTION

1. Field of the Invention

This invention relates to a variable temperature stage device for an electron microscope and more particularly to such device comprising a goniometer, means detachable from the goniometer for supporting a specimen holder, means connected with the goniometer for selectively cooling the specimen holder and means for selectively cooling the specimen holder.

2. Description of the Prior Art

It is known that the main difficulty in the fabrication of a variable temperature stage device lies in the fact that the following factors have to be harmonized with each other:

firstly, the need to maintain the freedom of displacement of the goniometer on which the detachable support elements of the specimen holder are positioned and to make it possible to insert the equipment which supports the specimen to be analysed, through an entry port of the microscope chamber, and secondly, the need to ensure that the specimen holder can be cooled and heated across a wide range of temperatures and to reduce any vibrations that might impair the resolution of the electron microscope.

In certain known variable temperature stage devices, the means for cooling the detachable supporting means includes a copper braid in contact with a container filled with a cooling liquid. The heat exchange between the cooled detachable supporting means and the specimen holder is effected through a simple metal-to-metal interface between the cold head of the goniometer and the detachable supporting means. In this case, the minimum temperature achieved is often excessively high, in the range of 100 degrees Kelvin when a cooling agent such as liquid nitrogen is in the goniometer head. In this respect, reference could be made to the embodiment described in the German Patent Application No. 2,138,567 which concerns a specimen holder inserted through a microscope port and cooled by means of metallic contact with a liquid helium container, although this type of microscope does not comprise a goniometer.

Other known variable temperature stage devices use cooling means in the form of circulation of liquid in or around a specimen holder supporting means itself, as disclosed in the German Patent Application No. 1,910,771. This arrangement does not enable the specimen to be inserted through the entry port. The heating means of these stage devices are generally provided by the Joule effect through a heating resistor which is embedded in the specimen holder.

The heating means of greater complexity may be provided by an electron stream which is directed towards the side of the specimen holder which is opposite the one supporting the specimen, as described in the German Patent Application No. 1,910,771. However, this mode of heating calls for effective means of protection against the electron stream.

OBJECTS OF THE INVENTION

The main object of this invention is to improve the variable temperature stage device for an electron microscope. More specific objects of this invention are to eliminate or minimize the above-described difficulties.

Another object of this invention is to provide a stage device having detachable specimen supporting means, the thermal capacity of which is very low.

Another object of this invention is to obtain a minimum temperature for a specimen supporting means which is distinctly below 100 Kelvin degrees, and at the same time, to provide a very rapid temperature variation.

SUMMARY OF THE INVENTION

These objects are accomplished in accordance with this invention, one embodiment of which comprises a variable temperature stage including heat insulating means which support the specimen holder and are affixed to the detachable supporting means and stay in connection with the cooling means, a portion of the specimen holder and a flexible metal joint by means of a clamping arrangement.

In order to maintain full thermal contact between the specimen holder and the cooling means such as the cooling head of the goniometer, the heat insulating means have at least three discontinuous insulating rests against which said portion of the specimen holder is applied, the other side of this specimen holder being in contact with the cooling means through the flexible metal joint. The specimen holder and the flexible metal joint are clamped by means of screwing elements which are guided from the outside the microscope and make the specimen holder supporting means and the goniometer plate form one piece with each other. This provides for simultaneous thermal contact between the cold end of the cooling head and the specimen holder.

Thus, the interface between the supporting means and the specimen holder is very small, since it is constituted by discontinuous resting points, preferably made of Teflon, and since conduction losses occur through the surface of these points.

Again, in order to reduce the thermal capacity of the detachable supporting means which, according to the Prior Art, depends on the electrical wires connected to a heating resistor, the heating means embodying the invention include means for transferring heat by optical radiation, such as incandescent lamps which are disposed in the heat insulating means and face specimen holder portions.

BRIEF DESCRIPTION OF THE DRAWING

Other advantages to this invention will become as apparent as the following description of preferred embodiments, the description of which should be considered together with the accompanying drawings, in which.

DESCRIPTION OF THE PREFERRED EMBODIMENTS

Figure 1:
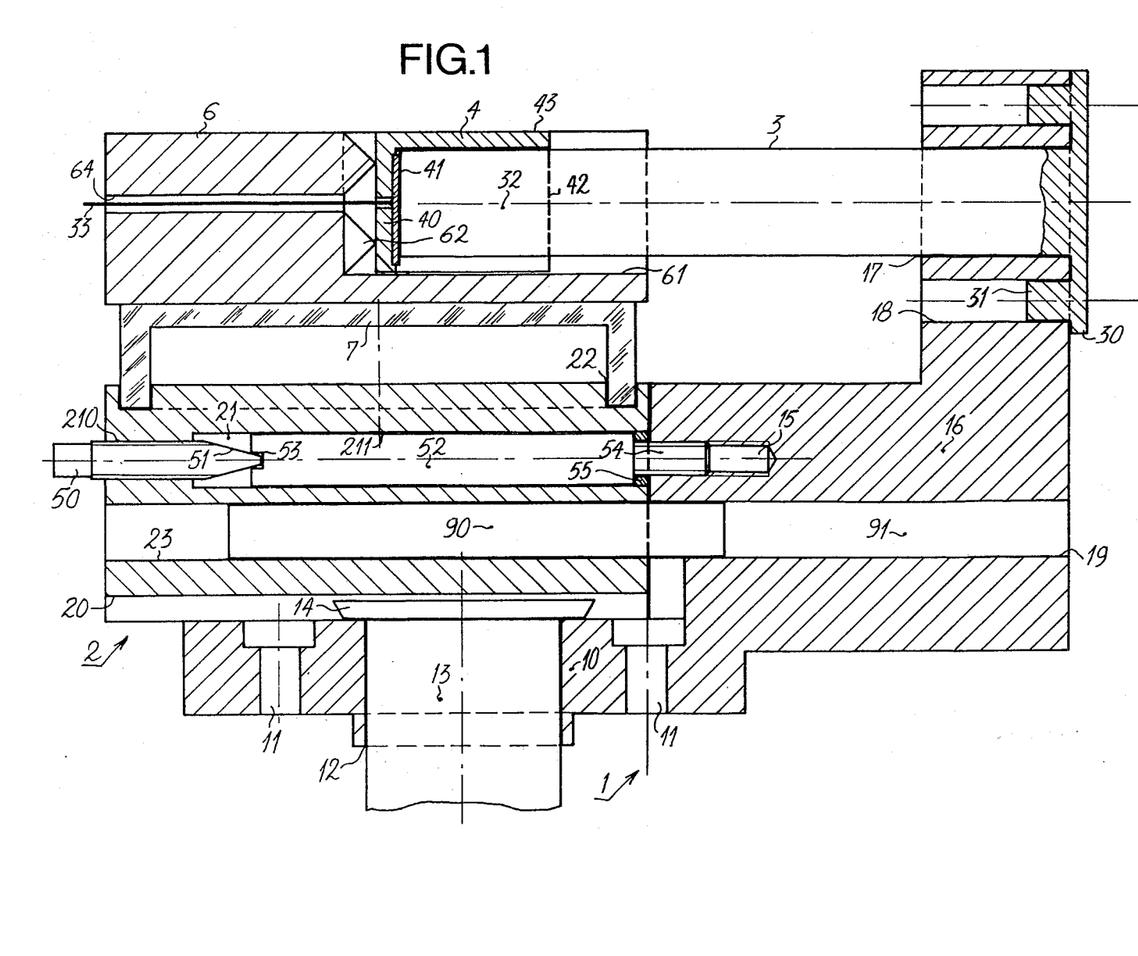
FIGS. 1, 2 and 3 are respectively a sectional view taken along the line I—I in FIG. 2, a top view and a left side view of the variable temperature stage device embodying the invention.
Figure 2:
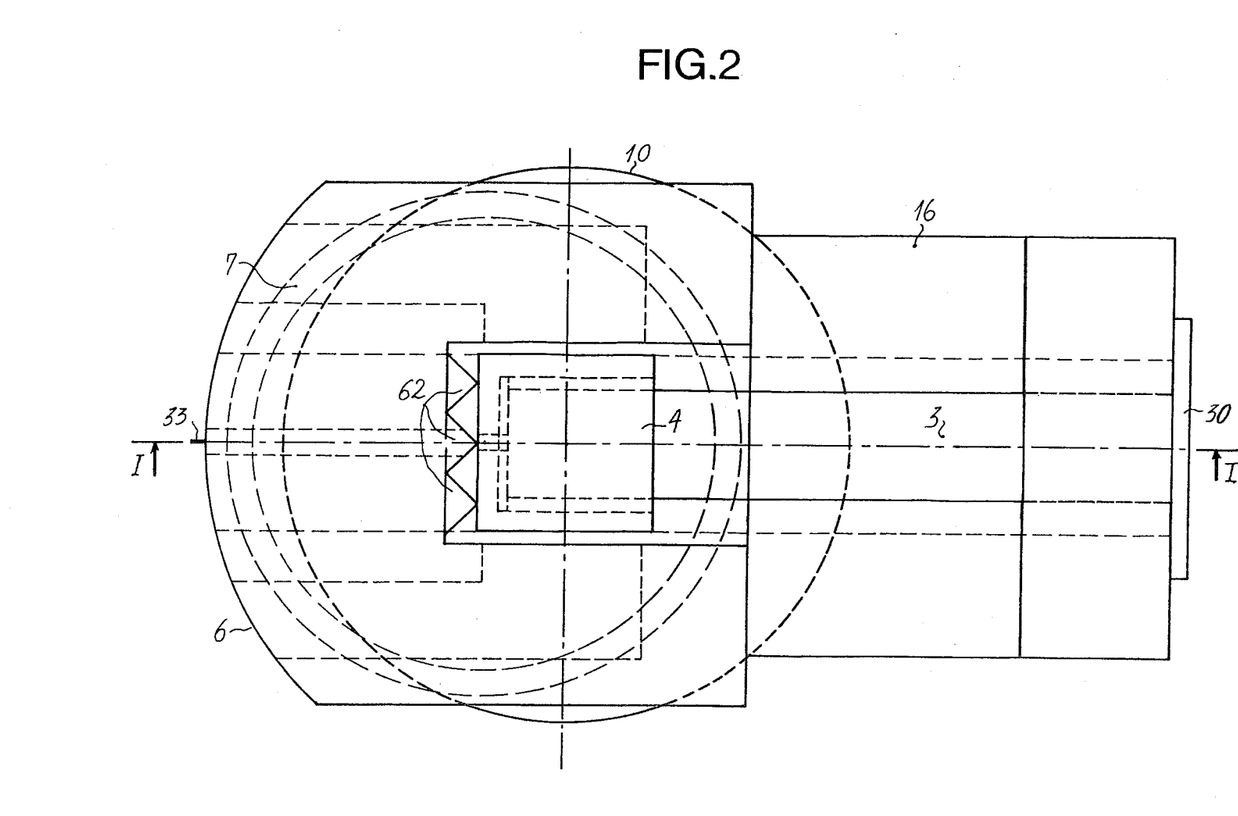
Figure 3:
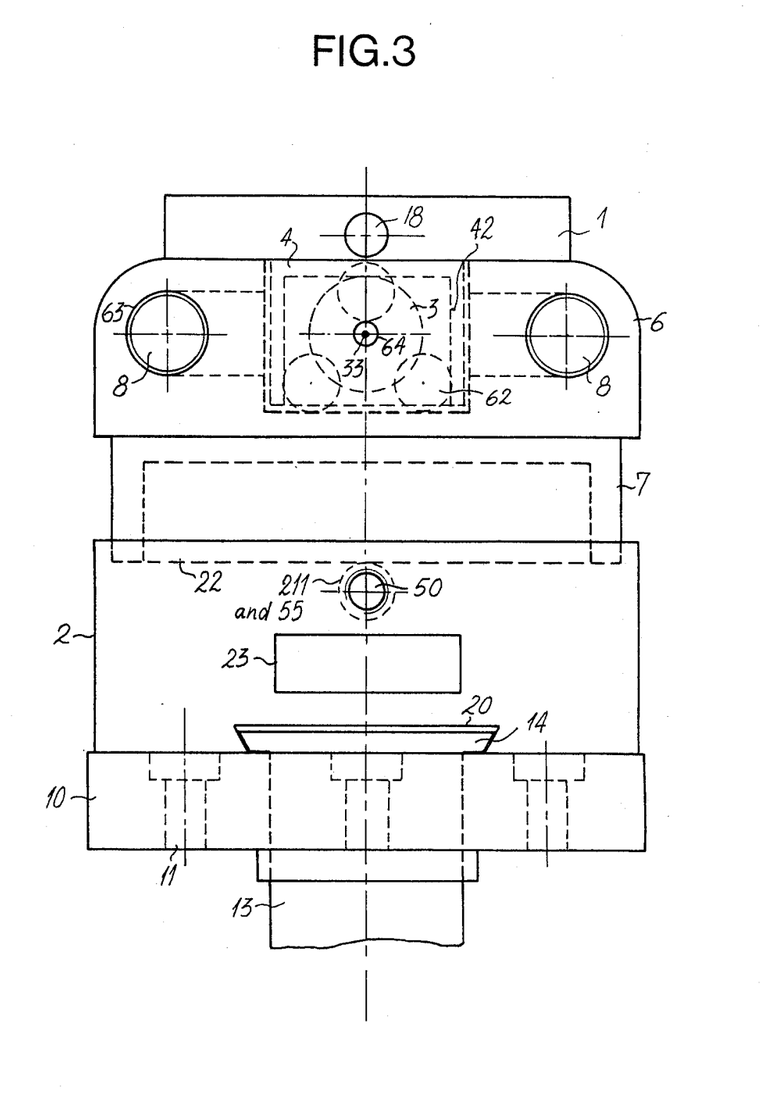

With reference to FIGS. 1 to 3, the variable temperature stage device embodying the invention comprises, as a non-detachable portion from the remainder of electron microscope chamber, a goniometer including plate 1 forming an integral part of the device the goniometer is shown only schematically in the drawing. A portion of a double or treble tilting goniometer forms one piece with the structure of the microscope chamber.

Figure 4:
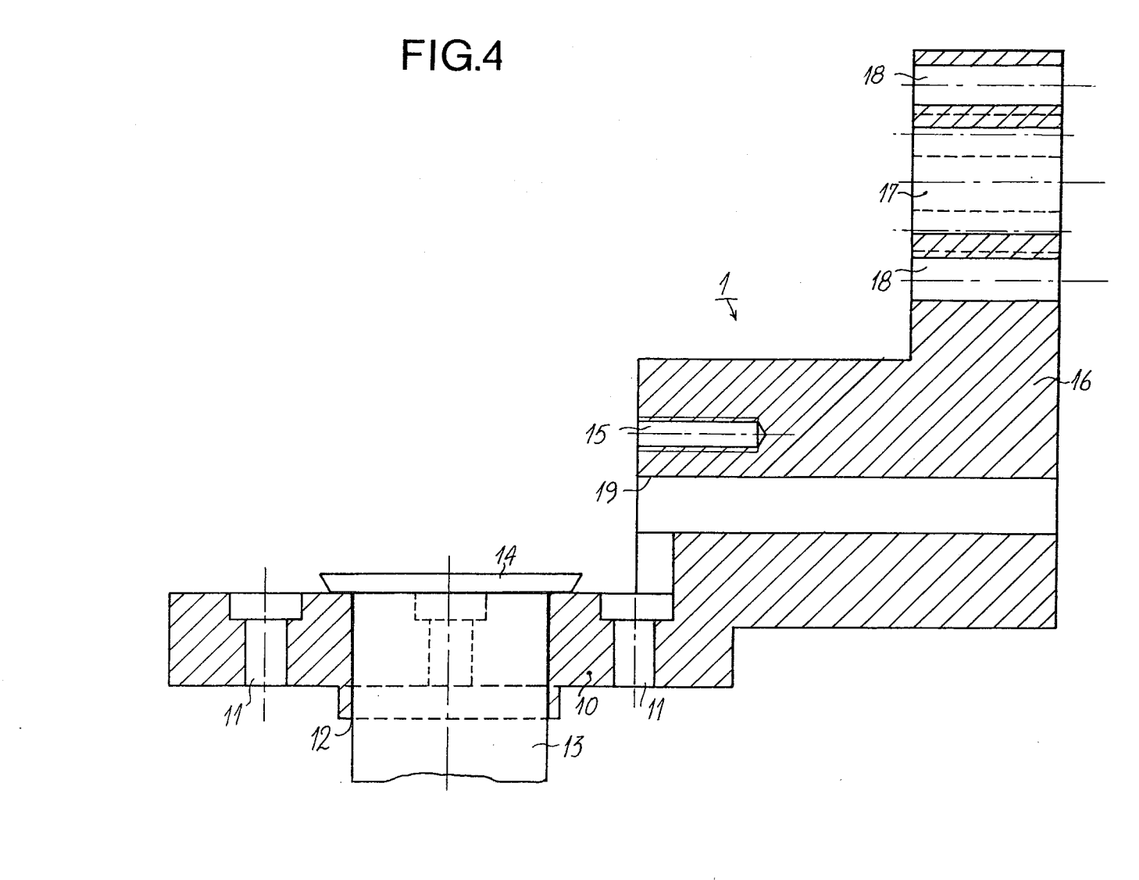
FIGS. 4, 5 and 6 are respectively a sectional view taken along the line IV—IV of FIG. 5, a top view and a sectional view taken along the line VI—VI of FIG. 5 of the goniometer plate supporting the detachable support.
Figure 5:
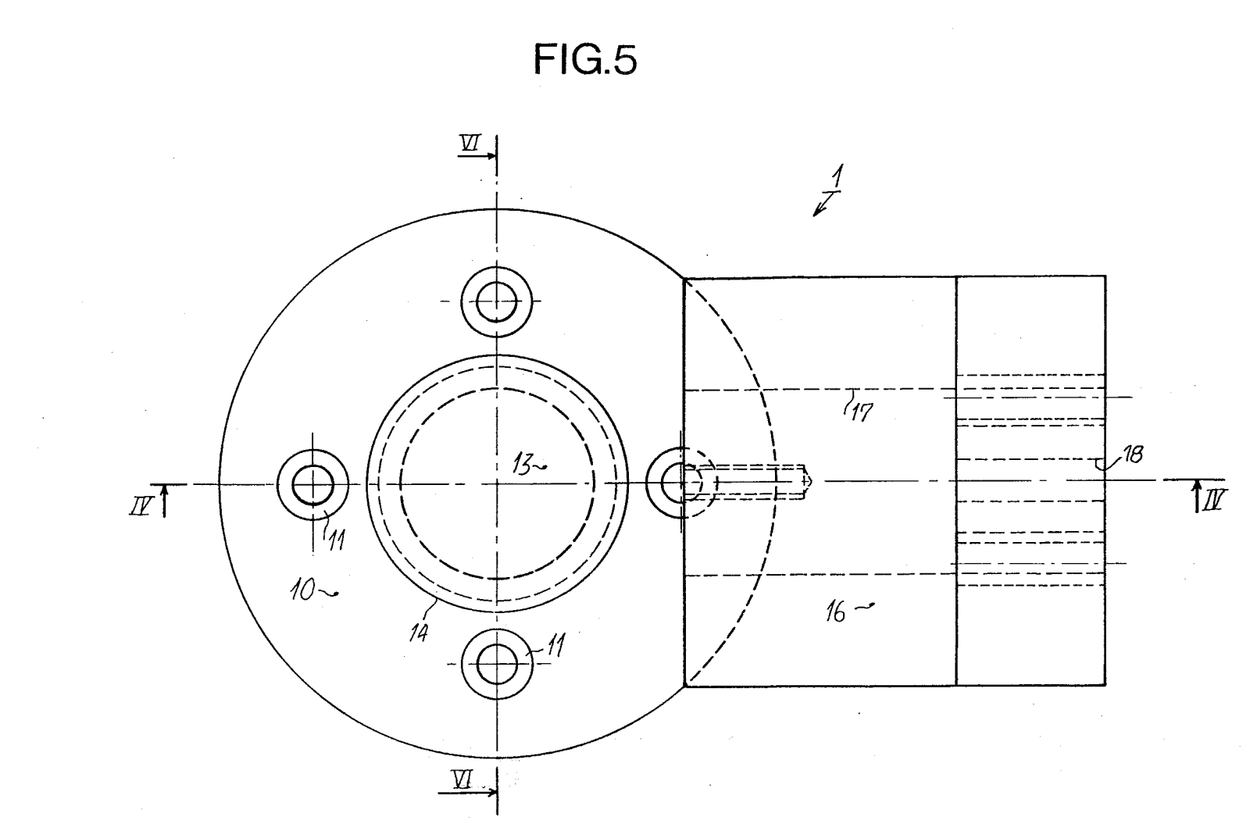
Figure 6:
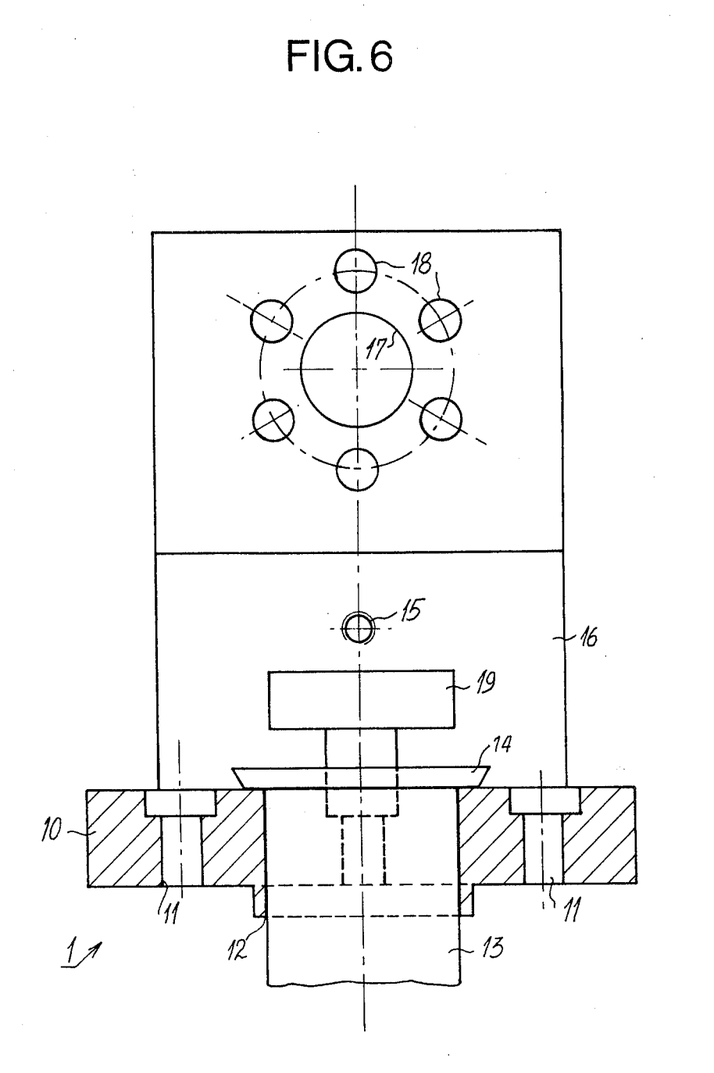

The plate 1 of the goniometer is detailed in FIGS. 4 to 6. Plate 1 has a general square shape with a circular base 10 carrying support 2 and a vertical side carrying a cooling head 3 of the specimen holder 4.

The plate 1, preferably made of brass, is fixed to the frame of the goniometer by means of bolts fitting into four passage holes 11, equally distributed around the center of base 10. Bore 12 at the center of the base 10 provides for the exact-fitting insertion of a ring 13 that abuts on the upper surface of the base 10 through a flange 14. The flange 14 has an accomodated dovetail that guides a longitudinal groove with a complementary accomodating dovetail 20 (FIG. 3) of the lower portion of the support 2 when support 2 is inserted into the microscope chamber.

Figure 7:
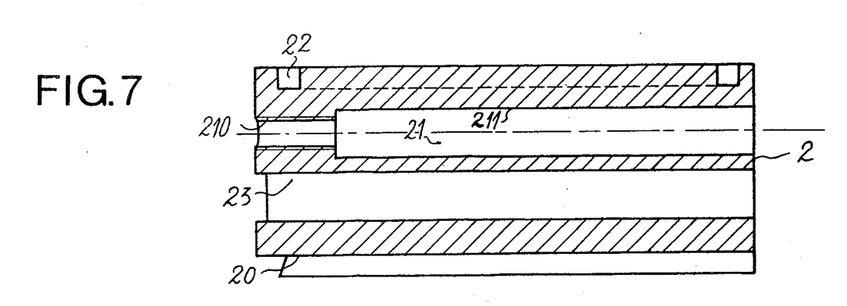
FIGS. 7, 8 and 9 are respectively a sectional view taken along the line VII—VII of FIG. 8 a top view and a left side view of the detachable support.
Figure 8:
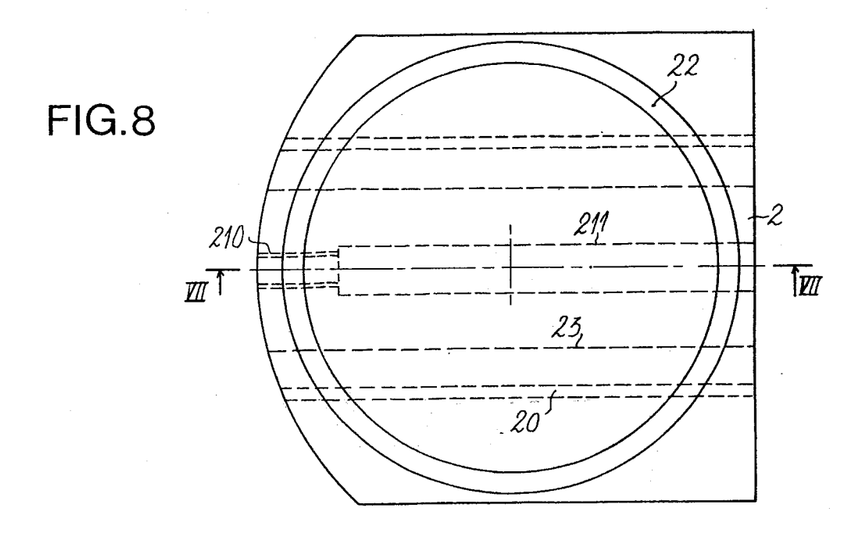
Figure 9:
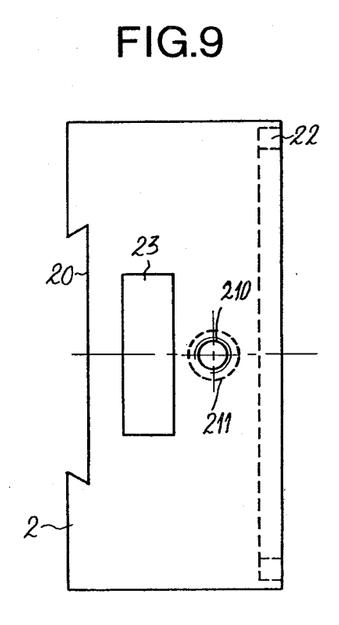

Referring to FIGS. 7 to 9, a longitudinal bore 21 in the upper portion of the support 2 includes small section 210 situated towards an entry port of the microscope chamber. Section 210 is tapped to provide for the insertion of a thread rod 50 (FIGS. 1 and 3). A large section 211 of the bore 21 contains a cylinder 52 (FIG. 1) which is mounted so as to allow free rotation substantially without longitudinal displacement. When the support 2 is introduced into the chamber by sliding the groove 20 along the flange 14, the threaded end of the rod 50 is screwed into the tapped section 210 by having a surface of the rod turned outside the microscope chamber through the entry port. The inner end 51 of the rod 50 is provided with crenellated or bevelled edges which fit into the split or groovedsided tip 53 of the cylinder 52. The other end 54 of the cylinder 52 is threaded and has a set-back that comes to rest against a Teflon ring 55. The ring 55 has been stuck previously against a tapped and recessed hole 15 in the vertical portion 16 of the plate 1. The threaded end 54 is thus screwed into the tapped recessed hole 15. This screwing makes it possible to fasten the support 2 tightly to the plate of the goniometer and make these elements integral with each other throughout the time that the specimen is under observation, and also to set up a thermal contact between the cooling head 3 and the specimen holder 4 through the crushing of a joint 41, as described infra.

The cooling head 3 passes through a bore 17 in the upper vertical portion of the plate 1 of the goniometer so ridge 30 abuts on the goniometer. Ridge 30 has six dog points 31 (FIG. 1) guided into holes 18 of the plate 1. The head 3 is cooled by a tubulure (not shown) which is made of a flexible rust-proof material and which is suited to receive nitrogen gas under high pressure, in the range 200 bars, and deliver expanded cold gas. The cooling is provided by the expansion of the high pressure nitrogen at the other end 32 of the head 3. This cylindrical end 32 of the head 3 extends over the base 10 of the plate 1 and partly over the support 2. End 32 is capped by the specimen holder 4, shaped as a hollow parallelipiped. The holder 4 is made preferably of Duralumin in order to provide good thermal conduction and low thermal capacity. The vertical back end 40 of the holder 4 is stayed firstly by the end 32 of the cooling head 3 by means of a flexible metal joint 41 which is made preferably of indium and embedded in the back end 40, and secondly by a heat insulation element 6 which is made mostly of Teflon.

Figures 10, 11:
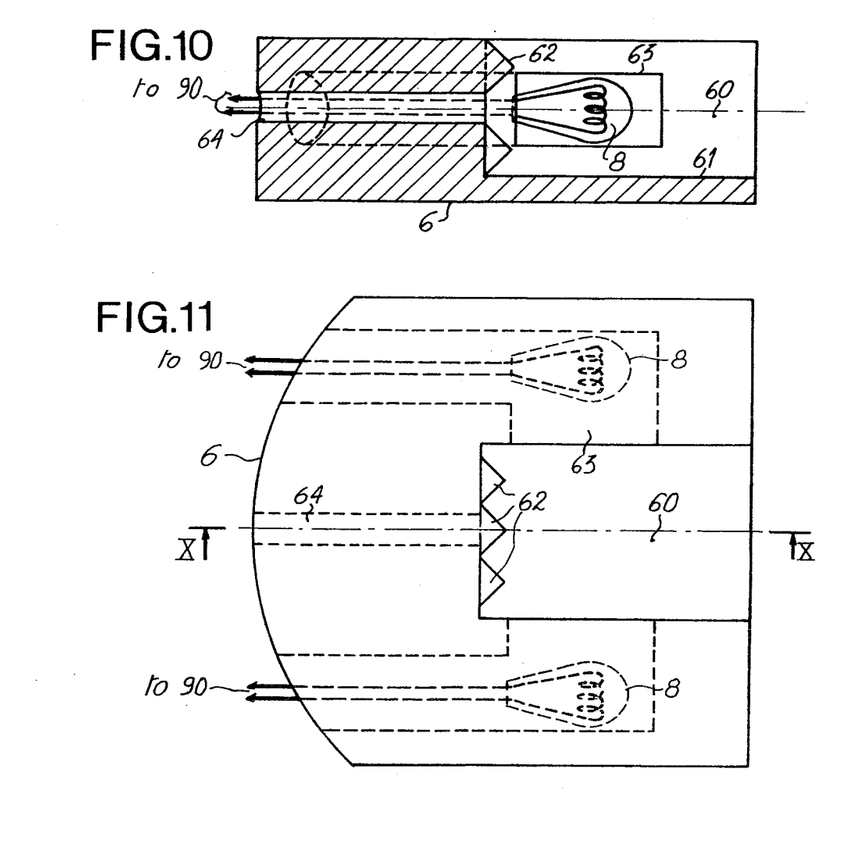
FIGS. 10, 11 and 12 are respectively a sectional view taken along line X—X of FIG. 11 a top view and a right side view of the heat insulation element with discontinuous resting points.
Figure 12:
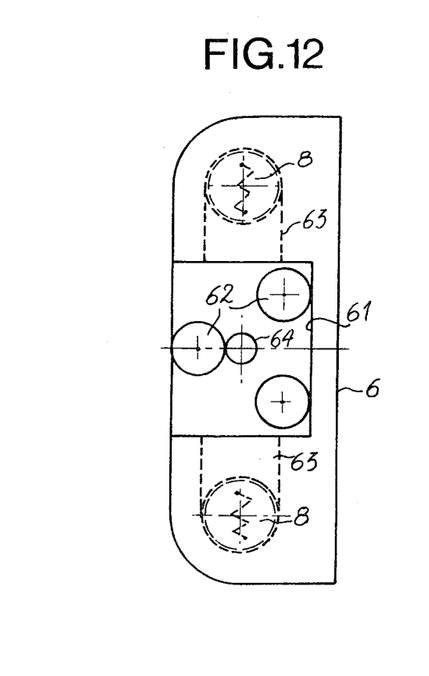

The heat insulation element 6, detailed in FIGS. 10 to 12, incorporates a centrally located longitudinal cavity 60, shaped as a parallelipiped, open at the top thereof and at the side towards the head 3. Cavity 60 is suited to receive the specimen holder 4, having end edges 40 and two vertical side walls 43 extending upwardly from the horizontal floor 61 of the cavity 60. The vertical side wall of the cavity 60 is equipped with three insulating Teflon points 62 which are equally distributed around the horizontal axis of the head 3, as shown in FIG. 12. For the assembly of the elements 6, 4 and 41, a tensioning wire 33 (FIG. 1) is used. Wire 33 first passes through a conduit 64 in the element 6 and the specimen holder 4. The wire 33 is integrally connected to the joint 41 (FIG. 1) and makes it possible simply to fasten the holder 4 tightly against the points 62. After the support 2 supporting the element 6 is set up, the cylinder 52 is screwed into the tapped hole 15 of the plate 1 using the insertion rod 50 to crush joint 41 and provide thermal contact of the cold end 32 of the head 3 with the specimen holder 4.

The element 6 rests solidly on a hollow, cylindrical dome 7 which is made of glass or similar material and which fits into a circular groove 22 (FIGS. 7–9) on the upper surface of the support 2. The dome 7 helps restrict heat conduction losses between the upper portion of the stage device which is made up principally of the element 6 and the lower portion 2, 10 which is fixed to the goniometer.

The variable temperature stage device is heated by optical radiation means such as incandescent lamps 8 (FIGS. 10–12). Two such lamps 8 are suitably embedded in the lateral elbow conduits 63 of the element 6, from which the heat emerges towards the vertical sidewalls 42 of the specimen holder 4. The lamps 8 are supplied with power through a transfer switch housed in the lower portion of the device. As shown in FIG. 1, the switch includes a connecting plug 90 which is connected to the lamp 8 by flexible conductor wires and inserted into a rectangular-sectioned passage 23 in the support 2, and a connecting socket 91 which is connected to an adjustable voltage source (not shown) and inserted into a rectangular-sectioned passage 19 in the plate 1 of the goniometer. When the support 2 is fixed to the plate 1 by screwing on the cylinder 52, the male connecting elements of the plug 90 emerging from the support 2 make contact with the female connecting elements of the socket 91 and thus connects the lamps 8 to the voltage source therefor.

A stage device embodying the invention has made it possible to obtain the temperature of liquid nitrogen, within about 15 minutes, at the level of the specimen which is supported on the upper surface 43 of the holder 4. Variable-speed temperature gradients were applied to the specimen within a range extending from 77 to 500 Kelvin degrees.

Although the invention has been described with reference to a preferred type of embodiment, it remains understood that other arrangements and modifications in the structure and organization of the various components of the stage device may be devised by one skilled in the art without departing from the spirit and scope of the invention.

What we claim is:

1. A variable temperature stage device for an electron microscope including a goniometer, said stage device comprising:
   means detachable from the goniometer for supporting a specimen holder,
   means connected with said goniometer for selectively cooling said specimen holder,
   means for selectively heating said specimen holder,
   a flexible metal joint crushed between said cooling means and specimen holder,
   a clamping structure, and
   heat insulating means for supporting said specimen holder and affixed to said detachable supporting means to be connected by said clamping structure in abutting relation to a portion of said specimen holder, said clamping structure holding the cooling means against said flexible metal joint, in turn held in place against the specimen holder by a force exerted through the metal joint by the cooling means.

2. The device of claim 1 wherein said heat insulating means includes at least three mutually spaced thermal insulating regions against which said portion of said specimen holder abuts, another side of said specimen holder portion contacting said cooling means through said flexible metal joint.

3. The device of claim 1 or 2 wherein said clamping structure is formed by a plate of the goniometer integral with said detachable supporting means and includes screw means positioned to be controlled from the outside of said electron microscope to control the position of said specimen holder and said flexible metal joint.

4. The device of claim 1 or 2 further comprising an element made of glass or similar material resting on said detachable support means for carrying said heat insulating means.

5. The device of claim 1 or 2 wherein at least the parts of said heat insulating means in contact with said specimen holder are made of Teflon.

6. The device of claim 1 wherein said flexible metal joint is made of indium.

7. The device of claim 1 wherein said specimen holder is made of Duralumin.

8. The device of claim 1 comprising guiding means for inserting said detachable supporting means into said goniometer and means controlled from the outside of said electron microscope for fastening said detachable supporting means to said goniometer.

9. The device of claim 8 wherein said guiding means comprises one groove and one slider with complementary fitting sections included in said supporting means and said goniometer respectively, or vice versa.

10. The device of claim 8 or 9 wherein said fastening means comprises a cylindrical element mounted for free rotation in said supporting means, one end of the element being screwed into a tapped hole of said goniometer, and a rod controlled from the outside of said electron microscope for rotating the cylindrical element into the tapped hole.

11. The device of claim 10 wherein said detachable supporting means includes a bore, the bore being positioned to guide a face of said rod working in conjunction with said cylindrical element.

12. The device of claim 1 wherein said heating means includes means for transferring heat by optical radiation.

13. The device of claim 12 wherein said heat transferring means is inserted in said heat insulating means and faces portions of said specimen holder.

14. The device of claim 12 wherein said heat transferring means comprises at least one incandescent lamp.

15. The device of claim 12, 13 or 14 wherein said detachable supporting means and said goniometer respectively include electrical connecting means connected to said heat transferring means and adapted to be connected to a power supply means, said detachable supporting means and said goniometer being mutually connected when said supporting means is affixed to said goniometer.

16. An electron microscope including a goniometer structure comprising a specimen holder having a cavity and an exterior, a cooling head fixedly mounted on the goniometer structure so it is inserted into the cavity to abut against at least one interior wall of the cavity and to have high thermal conductivity with the holder and specimens carried thereby, and means for supporting the holder on the goniometer, said supporting means including a solid heat insulating structure, the exterior of the cavity contacting no substantial solid surfaces other than the heat insulating structure to minimize heat transfer from the holder except between it and the head.

17. The electron microscope of claim 16 wherein the cooling head is a rod like element having an end face bearing against an interior face of the cavity, the holder having an exterior face opposite from the interior face, the exterior face abutting against at least three co-planar spaced regions of the solid heat insulating structure.

18. An electron microscope including a goniometer structure comprising a specimen holder having a cavity and an exterior, a cooling head fixedly mounted on the goniometer structure so it is inserted into the cavity to engage at least one interior wall of the cavity and to have high thermal conductivity with the holder and specimens carried thereby, means for supporting the holder on the goniometer, said supporting means including a solid heat insulating structure, the exterior of the cavity contacting no substantial solid surfaces other than the heat insulating structure to minimize heat transfer from the holder except between it and the head, the cooling head being a rod like element having an end face bearing against an interior face of the cavity, the holder having an exterior face opposite from the interior face, the exterior face resting against at least three co-planar mutually spaced regions of the solid heat insulating structure, means for holding the specimen holder in tension, the holding means holding the holder so portions of the holder are between the regions so the specimen holder contacts only the spaced coplanar regions and the holding means, the holding means including a wire connected to the specimen holder for pulling the exterior face against the regions, the cavity including a back up face for the interior face, the interior cavity face including a crushable plate having first and second faces crushed against as well as by the end and back up faces, the second face of the crushable plate opposite from the first face being connected to the wire, the wire extending through aligned apertures in the exterior face and the heat insulating structure.

* * * * *

UNITED STATES PATENT AND TRADEMARK OFFICE
CERTIFICATE OF CORRECTION

PATENT NO. : 4,427,891
DATED : January 24, 1984
INVENTOR(S) : GEORGES et al

It is certified that error appears in the above-identified patent and that said Letters Patent is hereby corrected as shown below:

On the title page
Item [30] Foreign Application Priority Data should read

-- September 20, 1979 [FR] France     79 23439 --

Signed and Sealed this

Twenty-fourth Day of April 1984

[SEAL]

Attest:

GERALD J. MOSSINGHOFF

Attesting Officer     Commissioner of Patents and Trademarks